United States Patent
Kitamura et al.

(10) Patent No.: US 6,906,596 B2
(45) Date of Patent: Jun. 14, 2005

(54) OSCILLATION CIRCUIT AND A COMMUNICATION SEMICONDUCTOR INTEGRATED CIRCUIT

(75) Inventors: Tomomitsu Kitamura, Takasaki (JP); Yasuyuki Kimura, Maebashi (JP); Ken Suyama, Mamaroneck, NY (US); Aleksander Dec, Yonkers, NY (US)

(73) Assignees: Renesas Technology Corp., Tokyo (JP); Epoch Microelectronics, Inc., White Plains, NY (US)

( * ) Notice: Subject to any disclaimer, the term of this patent is extended or adjusted under 35 U.S.C. 154(b) by 94 days.

(21) Appl. No.: 10/253,922

(22) Filed: Sep. 25, 2002

(65) Prior Publication Data

US 2004/0056725 A1 Mar. 25, 2004

(51) Int. Cl.⁷ ............................................... H03L 7/00
(52) U.S. Cl. ............................ 331/36 C; 331/117 FE; 331/183; 331/182; 331/185; 331/177 V; 331/117 R; 455/260; 455/180.4; 455/182.2; 455/180.3; 455/179.1; 327/156
(58) Field of Search ....................... 331/117 FE, 182, 331/183, 185, 74, 36 C, 177 V, 117 R; 455/180.4, 260, 182.2, 180.3, 179.1; 327/156

(56) References Cited

U.S. PATENT DOCUMENTS 6,268,778 B1 * 7/2001 Mucke et al. ............ 331/117 R
6,750,727 B1 * 6/2004 Sutardja .................. 331/117 R

* cited by examiner

Primary Examiner—Arnold Kinkead
(74) Attorney, Agent, or Firm—Mattingly, Stanger, Malur & Brundidge, P.C.

(57) ABSTRACT

A voltage controlled LC resonance oscillation circuit has a plurality of capacitive elements connected to an output node. These capacitive elements are applied with voltages at opposing terminals for selecting an oscillating frequency band, so that the oscillating frequency band can be changed step by step in accordance with the selection voltage. The capacitive elements include at least one variable capacitive element such as a MOS capacitor, the capacitance of which is varied in accordance with a voltage applied thereto. The MOS capacitor is similar in structure to a MOS transistor. The variable capacitive element can be supplied at a terminal opposite to the output node with a voltage from a variable voltage source, for example, in place of the selection voltage. The voltage controlled LC resonance oscillation circuit can measure the output amplitude and oscillating frequency without affecting the characteristics thereof, and reduce the parasitic capacitance.

16 Claims, 9 Drawing Sheets

OSCILLATION CIRCUIT AND A COMMUNICATION SEMICONDUCTOR INTEGRATED CIRCUIT

BACKGROUND OF THE INVENTION

The present invention relates generally to techniques which are effectively applied for improving the characteristics of a voltage controlled oscillation circuit (VCO) capable of switching from one oscillating frequency to another as well as the characteristics of an on-chip VCO, and facilitating measurements of the characteristics of such VCOs, and more particularly, to techniques which are effectively utilized in a VCO mounted in a high frequency semiconductor integrated circuit for demodulating a reception signal and modulating a transmission signal in radio communication apparatuses, for example, a portable telephone and the like which can transmit and receive signals in a plurality of bands.

A radio communication system such as a portable telephone uses a PLL (phase locked loop) circuit which has a VCO for generating an oscillating signal at a predetermined frequency. The oscillating signal is combined with a reception signal and a transmission signal. Conventional portable telephones include a dual-band portable telephone which can handle signals in two frequency bands, for example, a GSM (Global System for Mobile Communication) signal in a band of 880–915 MHz and a DCS (Digital Cellular System) signal in a band of 1710–1785 MHz. Some dual-band portable telephones are designed to support two different bands with a single PLL circuit by switching the frequency of the PLL circuit.

In recent years, however, a need exists for a triple-band portable telephone which can handle, for example, a PCS (Personal Communication System) signal in a band of 1850–1915 MHz in addition to the GSM and DCS signals. It is also contemplated that the portable telephones are required to support a larger number of bands in the future.

For a high frequency semiconductor integrated circuit (hereinafter called the "high frequency IC") designed to modulate a transmission signal and demodulate a reception signal, for use in such a portable telephone which can support a plurality of bands, a direct conversion system is effective from a viewpoint of a reduction in the number of parts. While the direct conversion system is relatively easy in supporting a plurality of bands, a VCO should be capable of oscillating over a wide frequency range. In this event, when a single VCO is used with the intention to cover the overall frequency range, the resulting VCO would be extremely sensitive to a control voltage applied thereto, and therefore vulnerable to extraneous noise and fluctuations in a power supply voltage.

On the other hand, a reduction in the number of parts may be effectively accomplished by forming a VCO, which has been typically fabricated in a module separate from a high frequency IC in many cases, on the same semiconductor chip on which the high frequency IC is fabricated. However, since an on-chip VCO manufactured by the current technologies experiences large variations in the absolute value of the oscillating frequency, the on-chip VCO must be provided with a function of correcting the oscillating frequency after the manufacturing. However, if the variations are corrected by trimming based on a mask option or a bonding wire option, typically used in conventional semiconductor integrated circuits, the cost is inevitably increased.

SUMMARY OF THE INVENTION

When a high frequency IC having an RFVCO integrated on the single chip presents such a varying frequency that cannot be corrected even by a corrector circuit, such a high frequency IC must be found in a selection testing for removal by measuring the frequency. In addition, a high frequency IC which fails to generate an output amplitude of a VCO exceeding a predetermined level must be also removed through the selection test. FIG. 3 shows the relationship between the output amplitude of an LC resonance VCO, considered by the inventors, and the CN ratio. In FIG. 3, the horizontal axis represents the amplitude of the output oscillated by the VCO, while the vertical axis represents the ratio N/C of noise to carrier which is the inverse of the CN ratio. It can be seen from FIG. 3 that the ratio of noise becomes relatively larger as the output amplitude of the VCO becomes smaller. Also, the output amplitude of the LC resonance VCO depends on a loss in an LC resonance circuit, and an excessively large loss will cause the LC resonance VCO to stop oscillating. It is therefore necessary to measure the output amplitude of the VCO.

The inventors thought to provide a pad for outputting a signal divided by a frequency divider for PLL disposed next to an RFVCO such that the frequency can be measured in a selection test. The divided signal is measured because the measurement is easier at a lower frequency, and the thus provided pad does not affect the characteristic of the VCO. However, the measuring method as described above for measuring the frequency of the divided signal is disadvantageous in the inability to measure the output amplitude of the VCO. However, if a terminal (pad) was provided for directly measuring the output of the VCO, the terminal would cause an increase in a parasitic capacitance to offset the constants of the LC resonance circuit and accordingly change the characteristics of the VCO, thereby failing to precisely measure the frequency. In addition, since the terminal exclusive for measuring an amplitude is provided in addition to a terminal for measuring the frequency, the number of terminals is increased. Further, when the terminal for measuring the amplitude is used to measure the oscillating frequency, a high performance measuring device is required due to the extremely high frequency.

An RFVCO in a high frequency IC for use in a dual-band portable telephone capable of handling signals in accordance with GSM and DCS, considered by the inventors, and in a triple-band portable telephone capable of additionally handling a signal in accordance with PCS, is required to oscillate at an extremely high frequency such as 4 GHz. In the VCO which oscillates at such a high frequency, the parasitic capacitance more affects the inductor and variable capacitor which determine the oscillating frequency. More specifically, an inductor having a small inductance and a variable capacitive element having a small capacitance must be used for the VCO which oscillates at a high frequency such as 4 GHz, so that the parasitic capacitance becomes relatively larger. When a wide variable frequency is required as is the case with the dual-band system and triple-band system, a large parasitic capacitance would exacerbate a substantial capacitance changing rate, resulting in a failure in providing a desired variable frequency range. This problem was clarified by an investigation made by the inventors.

It is an object of the present invention to provide a voltage controlled oscillation circuit (VCO) which is capable of detecting an oscillating frequency and an output amplitude without affecting the characteristics thereof, and a communication semiconductor integrated circuit which contains the VCO.

It is another object of the present invention to provide a voltage controlled oscillation circuit (VCO) which is capable of oscillating at a high frequency with a reduced parasitic capacitance which affects the oscillating frequency, and a communication semiconductor integrated circuit which contains the VCO.

It is a further object of the present invention to provide a communication semiconductor integrated circuit which is capable of communicating signals in plurality of frequency bands, and comprises a plurality of oscillation circuits formed on the same semiconductor chip to thereby reduce the number of parts.

Representative aspects of the invention disclosed in this application may be summarized as follows.

An LC resonance oscillation circuit has a plurality of capacitive elements connected to an output node. These capacitive elements are applied at opposing terminals with voltages generated for selecting an oscillating frequency band, so that the oscillating frequency band can be changed step by step in accordance with the selection voltage. The capacitive elements include at least one variable capacitive element such as a MOS capacitor, the capacitance of which is varied in accordance with a voltage applied thereto. The MOS capacitor is similar in structure to a MOS transistor. The variable capacitive element can be supplied at a terminal opposite to the output node with a voltage from a variable voltage source, for example, in place of the selection voltage.

In an LC resonance oscillation circuit, the amplitude of the oscillating output may occasionally vary due to variations in an inductor (L) which forms part of the LC resonance circuit. According to the present invention, however, the output amplitude can be estimated by measuring the oscillating frequency while changing the capacitance of the LC resonance circuit. Thus, the oscillation circuit does not require a terminal for measuring the amplitude, as one of output terminals of the oscillation circuit, and therefore can detect the output amplitude without affecting the characteristics thereof. Particularly, when the oscillation circuit is formed on a semiconductor chip, it is anticipated that larger variations in resistive component of the inductor would cause correspondingly larger variations in the amplitude of the oscillating output. However, since the ability of the LC resonance oscillation circuit to estimate the output amplitude from the oscillating frequency facilitates a determination as to whether the output amplitude is not appropriate, it is possible to eliminate the disadvantage involved in the integration of the oscillation circuit on a semiconductor chip.

Also, according to another aspect of the present invention, an LC resonance oscillation circuit comprises an LC resonance circuit, a MOS transistor for driving the LC resonance circuit to resonate, and substrate voltage switching means for switching a substrate potential of the MOS transistor from a source potential to a fixed potential lower than the source potential such as a ground potential.

Since the substrate voltage switching means can reduce a parasitic capacitance on the drain of the MOS transistor, the oscillation circuit can provide a wider variable frequency range. Particularly, an LC resonance oscillation circuit which is required to oscillate at a high frequency is made up of an inductor having a small inductance and a capacitive element having a small capacitance, so that the parasitic capacitance accounts for a large proportion. Since the parasitic capacitance could narrow down the variable frequency range in applications which require a wide variable frequency range such as an oscillation circuit for communication, the application of the substrate voltage switching means for reducing the parasitic capacitance is extremely effective in such applications.

Other objects, features and advantages of the invention will become apparent from the following description of the embodiments of the invention taken in conjunction with the accompanying drawings.

DESCRIPTION OF THE EMBODIMENTS

In the following, embodiments of the present invention will be described with reference to the accompanying drawings.

Figure 1:
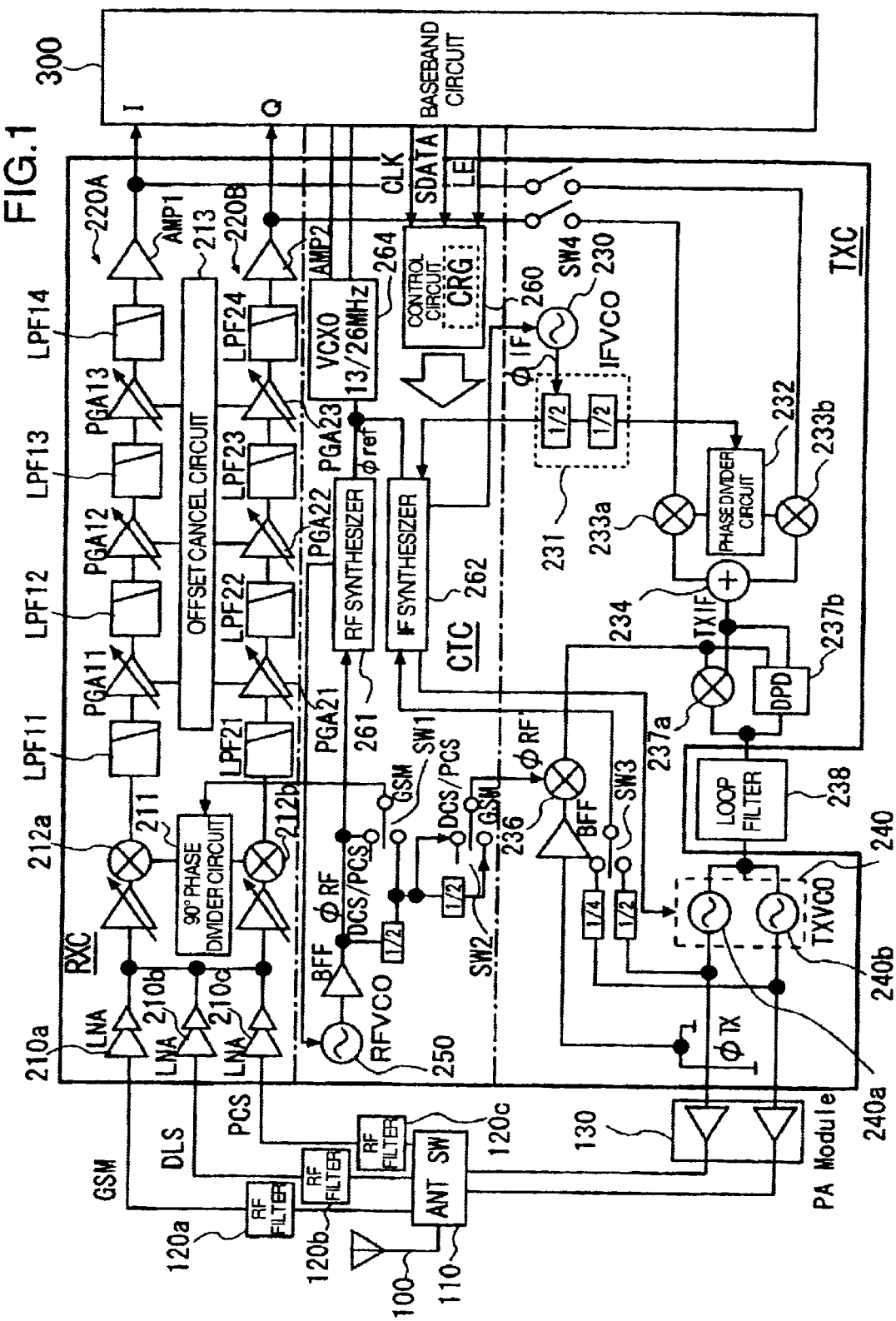
FIG. 1 is a block diagram illustrating an exemplary configuration of a multi-band communication semiconductor integrated circuit (high frequency IC) which applies the present invention, and a radio communication system using the communication semiconductor integrated circuit.

FIG. 1 is a block diagram illustrating an exemplary configuration of a multi-band communication semiconductor integrated circuit (high frequency IC) to which the present invention is applied, and a radio communication system using the communication semiconductor integrated circuit.

The radio communication system illustrated in FIG. 1 comprises an antenna 100 for transmitting and receiving signal radio waves; a switch 110 for switching transmission and reception; high frequency filters 120a–120c such as SAW filters for removing unwanted waves from a reception signal; a high frequency power amplifier 130 for amplifying a transmission signal; a high frequency IC 200 for demodulating a reception signal and modulating a transmission signal; and a baseband circuit (LSI) 300 for converting transmission data to I, Q signals and controlling the high frequency IC 200. The high frequency IC 200 is fabricated on a single semiconductor chip as a semiconductor integrated circuit.

Though not particularly limited, the high frequency IC 200 in this embodiment is designed for modulation and demodulation of signals in accordance with four communication schemes: GSM850, GSM900, DSC1800, and PSC1900. In correspondence, the radio communication system comprises the high frequency filter 120a for passing a reception signal for a GSM frequency band; the filter 120b for passing a reception signal in a DSC1800 frequency band; and the filter 120c for passing a reception signal in a PSC1900 frequency band. Since signals of the GSM850 and GSM900 are in frequency bands close to each other, the filter 120a is used in common to filter these signals in this embodiment.

The high frequency IC 200 is roughly composed of a reception related circuit RXC; a transmission related circuit TXC; and a control related circuit CTC which includes other circuits common to the transmission and reception such as a control circuit, a clock related circuit, and the like.

The reception related circuit RXC comprises low noise amplifiers 210a, 210b, 210c each for amplifying a reception signal; a phase divider circuit 211 for dividing an oscillating signal φRF generated by a high frequency oscillation circuit (RFVCO) 250 to generate orthogonal signals which are 90° out-of-phase from each other; demodulator circuits 212a, 212b each including a mixer for combining the reception signal amplified by the low noise amplifier 210a, 210b, 210c with the orthogonal signals generated by the phase divider circuit 211 for demodulation; high gain amplification units 220A, 220B for amplifying the demodulated I, Q signals, respectively, for delivery to the baseband circuit 300; and an offset cancel circuit 213 for canceling input DC offsets of the amplifiers within the high gain amplification units 220A, 220B.

The high gain amplification unit 220A comprises a plurality of low pass filters LPF 11, LPF 12, LPF 13, LPF 14 and gain control amplifiers PGA 11, PGA 12, PGA 13, which are alternately connected in series; and an amplifier AMP1 with a fixed gain connected at the final stage. The high gain amplification unit 220A amplifies the I signal and outputs the amplified I signal to the baseband circuit 300. Likewise, the high gain amplification unit 220B comprises a plurality of low pass filters LPF 21, LPF 22, LPF 23, LPF 24 and gain control amplifiers PGA 21, PGA 22, PGA 23, which are alternately connected in series; and an amplifier AMP2 with a fixed gain connected at the final stage, and amplifies the Q signal and outputs the amplified Q signal to the baseband circuit 300.

The offset cancel circuit 213 comprises A/D converter circuits (ADC) provided in correspondence to the gain control amplifiers PGA 11–PGA 23, respectively, for converting output potential differences, when their input terminals are short-circuited, to digital signals; DA converter circuits (DAC) each for generating an input offset voltage to reduce DC offsets in the outputs of the corresponding gain control amplifiers PGA 11–PGA 23 to zero based on the results of conversions made by the AD converters, and applying the input offset voltages to differential inputs; and a control circuit for controlling the AD converter circuits (ADC) and DA converter circuits (DAC) to perform an offset canceling operation.

The transmission related circuit TXC comprises an oscillation circuit (IFVCO) 230 for generating an oscillating signal $^{SM}$IF at an intermediate frequency, for example, 640 MHz; a frequency divider circuit 231 for dividing the oscillating signal φIF generated by the oscillation circuit 230 by a factor of four to generate a signal at 160 MHz; a phase divider circuit 232 for further dividing the signal divided by the frequency divider circuit 231 to generate orthogonal signals which are 90° out-of-phase from each other; modulator circuits 233a, 233b for modulating the generated orthogonal signals with the I signal and Q signal supplied from the baseband circuit 300; an adder 234 for combining the modulated signals; a transmission oscillation circuit (TXVCO) 240 for generating a transmission signal φTX at a predetermined frequency; an offset mixer 236 for combining a feedback signal extracted by a coupler or the like from the transmission signal φTX outputted from the transmission oscillation circuit (TXVCO) 240 with a signal φRF' generated by dividing the oscillating signal φRF generated by the high frequency oscillation circuit (RFVCO) 250 to generate a signal at a frequency which is equal to the difference in frequency between the feedback signal and signal φRF'; an analog phase comparator 237a and a digital phase comparator 237b for comparing the output of the offset mixer 236 with a signal TXIF generated by the adder 234 from a combination of the modulated signals to detect a phase difference; and a loop filter 238 for generating a voltage in accordance with the outputs of the phase detector circuits 237a, 237b.

The loop filter 238 includes a resistor and a capacitor which are connected to associated external terminals of the high frequency IC 200 as external elements. The transmission oscillation circuit (TXVCO) 240 comprises an oscillation circuit 240a for generating transmission signals for GSM850 and GSM900; and an oscillation circuit 240b for generating transmission signals for DCS1800 and PSC1900. The two oscillation circuits are provided because it is difficult to design a single transmission oscillation circuit which can cover an entire variable frequency range that is wider than those covered by the high frequency oscillation circuit 250 and intermediate frequency oscillation circuit 230.

The analog phase comparator 237a and digital phase comparator 237b are provided for promoting a draw-in operation at the time the PLL circuit starts the operation. Specifically, the digital phase comparator 237b is first used for phase comparison upon start of transmission, and is subsequently switched to the analog phase comparator 237a such that the phase loop can be rapidly locked.

The chip on which the high frequency IC 200 is fabricated further comprises a control circuit 260 for controlling the entire chip; an RF synthesizer 261 which constitutes an RF PLL circuit together with the high frequency oscillation circuit (RFVCO) 250; an IF synthesizer 262 which constitutes an IF PLL circuit together with the intermediate frequency oscillation circuit (IFVCO) 230; and a reference oscillation circuit (VCXO) 264 for generating a clock signal φref which serves as a reference signal for these synthesizers 261, 262. The synthesizers 261, 262 are each composed of a phase comparator circuit, a charge pump, a loop filter, and the like.

Since the reference oscillating signal φref is required to be highly accurate in frequency, an external quartz oscillator is connected to the reference oscillation circuit 264. A frequency such as 26 MHz or 13 MHz may be selected for the reference oscillating signal φref. This is because quartz oscillators oscillating at such frequencies are available at relatively low prices.

In FIG. 1, blocks labeled fractions such as ½, ¼ and the like represent frequency divider circuits, respectively, while a block labeled BFF represents a buffer circuit. Blocks labeled SW1, SW2, SW3 represent switches which are switched for a GSM mode for transmitting and receiving signals in accordance with the GSM scheme, and a DCS/PCS mode for transmitting and receiving signals in accordance with the DCS or PCS scheme to select a frequency division ratio for a signal to be communicated. A block labeled SW4 represents a switch which is controlled ON/OFF to supply the I, Q signals from the baseband circuit 300 to the modulation mixers 233a, 233b upon transmission. These switches SW1–SW4 are controlled by signals from the control circuit 260.

The control circuit 260 is provided with a control register CRG which is set based on a signal from the baseband circuit 300. Specifically, the control circuit 260 is supplied from the baseband circuit 300 with a clock signal CLK for synchronization, a data signal SDATA, and a load enable signal LE as a control signal for the high frequency IC 200. As the load enable signal LE is asserted to an effective level, the control circuit 260 sequentially fetches the data signal SDATA transmitted thereto from the baseband circuit 300 in synchronism with the clock signal CLK, and sets the data signal SDATA in the control register CRG. Though not particularly limited, the data signal SDATA may be serially transmitted. The baseband circuit 300 is mainly composed of a microprocessor.

Though not particularly limited, the control register CRG may be provided with a control bit for controlling the high frequency oscillation circuit (RFVCO) 250 and intermediate frequency oscillation circuit (IFVCO) 230 to start a measurement of the frequency of the VCO; a bit field for specifying a mode such as a reception mode, a transmission mode, an idle mode, a warm-up mode, and the like. Here, the idle mode is set to enter a sleep state in which only an extremely small number of circuits are left operative while a majority of circuits including at least the oscillation circuits are inoperative, such as in a waiting time. The warm-up mode is set to start the PLL circuits immediately before transmission or reception.

In this example, a transmission PLL circuit (TXPLL) for converting the frequency is composed of the phase detector circuits 237a, 237b; loop filter 238; transmission oscillation circuits (TXVCO) 240a, 240b; and offset mixer 236. In the multi-band radio communication system in this example, in response to a command from the baseband circuit 300, the control circuit 260 changes the frequency φRF of the oscillating signal from the high frequency oscillation circuit 250 for example in accordance with a channel to be used upon transmission/reception, and switches the switch SW2 in accordance with the GSM mode or DCS/PCS mode to change the frequency of the signal supplied to the offset mixer 236, thereby switching the transmission frequency.

Table 1 shows exemplary frequencies set for the oscillating signals φIF, φTX, φRF generated by the intermediate frequency oscillation circuit (IFVCO) 230, transmission oscillation circuit (TXVCO) 240, and high frequency oscillation circuit (RFVCO) 250, respectively, in the quad-band high frequency IC of this example.

TABLE 1

|  | IFVCO (MHZ) | TXIF (MHZ) | TXVCO (MHZ) | RFVCO (MHz) | |
|---|---|---|---|---|---|
|  |  |  |  | RECEPTION | TRANSMISSION |
| GSM850 | 640 | 80 | 824 | 3476 | 3616 |
|  | 640 | 80 | 849 | 3576 | 3716 |
| GSM900 | 640 | 80 | 880 | 3700 | 3840 |
|  | 640 | 80 | 915 | 3840 | 3980 |
| DCS1800 | 640 | 80 | 1710 | 3610 | 3580 |
|  | 640 | 80 | 1785 | 3760 | 3730 |
| PCS1900 | 640 | 80 | 1850 | 3860 | 3860 |
|  | 640 | 80 | 1910 | 3980 | 3980 |

As shown in Table 1, the oscillating frequency of the intermediate frequency oscillation circuit (IFVCO) 230 is set at 640 MHz for any of GSM, DCS, PCS in this example. The oscillating signal at 640 MHz is divided by the frequency divider circuit 231 and phase divider circuit 232 by a factor of eight, respectively, to generate a carrier (TXIF) at 80 MHz for modulation.

On the other hand, the oscillating frequency of the high frequency oscillation circuit (RFVCO) 250 is set at different values for a reception mode and a transmission mode, respectively. In the transmission mode, the oscillating frequency fRF of the high frequency oscillation circuit (RFVCO) 250 is set, for example, in a range of 3616 to 3716 MHz for GSM850; in a range of 3840 to 3980 MHz for GSM900; in a range of 3610 to 3730 MHz for DCS; and in a range of 3860 to 3980 MHz for PCS. Then, the oscillating frequency fRF is divided by the frequency divider circuit by a factor of four for GSM; and by a factor of two for DCS and PCS. The resulting signal is supplied to the offset mixer 236 as φRF'.

The offset mixer 236 outputs a signal corresponding to the difference in frequency between the signal φRF' and the transmission oscillating signal φTX from the transmission oscillation circuit 240 (fRF'–fTX), and the transmission PLL (TXPLL) operates such that the differential signal matches in frequency with the modulated signal TXIF. In other words, the TXVCO 240 is controlled to oscillate at a frequency corresponding to the difference between the frequency (fRF/4) of the oscillating signal φRF' from the RFVCO 250 and the frequency (fTX) of the modulated signal TXIF. This is a transmission operation in a system known as a so-called offset PLL system.

The VCO in accordance with one concept of the present invention (e.g. RFVCO 250) comprises, for example, a Colpitts oscillation circuit using an LC resonance circuit. A plurality of capacitive elements, each forming part of an LC resonance circuit, are arranged in parallel through respective switching elements associated therewith. The switching elements may be selectively turned on with the band switching signal VB3–VB0 to switch a connected capacitive element, i.e., the value C of the LC resonance circuit, thereby switching the oscillating frequency step by step. On the other hand, the RFVCO 250 has a variable capacitance diode as a variable capacitance element, the capacitance of which is changed by a control voltage Vc from a loop filter of the PLL circuit to continuously change the oscillating frequency.

Figure 2:
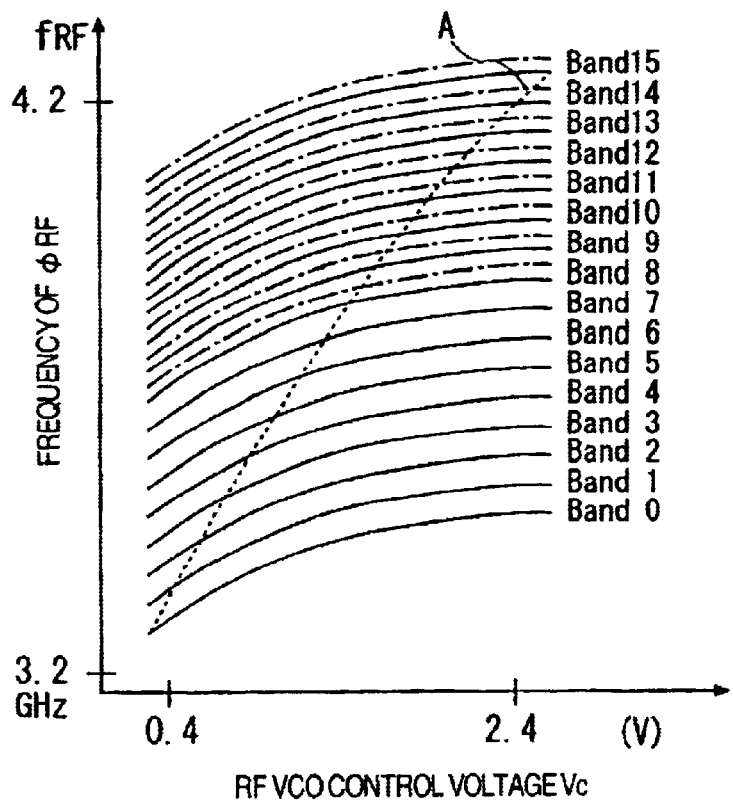
FIG. 2 is a graph showing the relationship between a control voltage Vc and an oscillating frequency fRF when a variable frequency range for the RFVCO is continuously changed and when it is changed intermittently in a plurality of bands.
Figure 3:
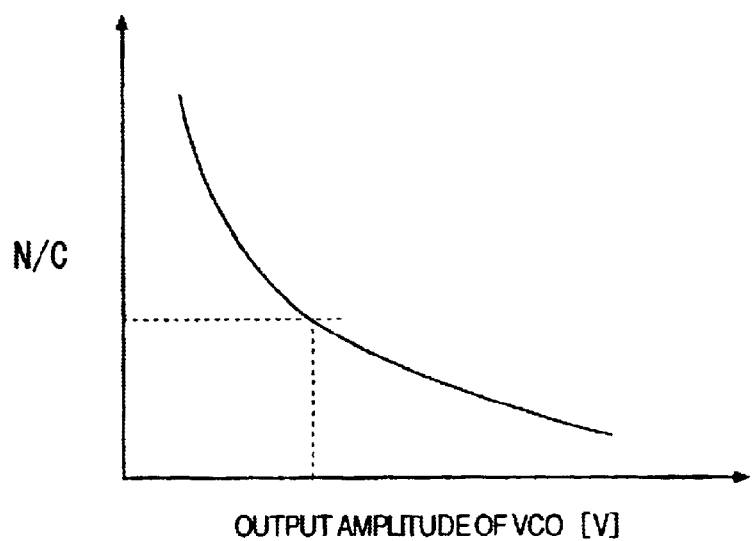
FIG. 3 is a graph showing the relationship between the output amplitude of the VCO and the CN ratio.

When a frequency range covered by the VCO is extended only with a change in the capacitance of the variable capacitance diode through the control voltage Vc, a resulting Vc-fRF characteristic exhibits an abrupt slope, as indicated by a broken line A in FIG. 2, to cause an increase in the sensitivity of the VCO, i.e., the ratio of a frequency changing amount to a control voltage changing amount ($\Delta f/\Delta Vc$), so that the VCO becomes more vulnerable to noise. In other words, slight noise introduced into the control voltage Vc would result in a large change in the oscillating frequency fRF of the VCO.

To solve this problem, the RFVCO 250 in this concept comprises a plurality of capacitive elements, which form part of the LC resonance circuit, in parallel to switch a used capacitive element in n stages with the band switching signal VB3–VB0 to change the value C, to control the oscillation along a plurality of Vc-fRF characteristic curves as indicated by solid lines in FIG. 2.

The high frequency IC 200 in FIG. 1 is provided with a function of measuring the frequency, and a function of correcting the frequency characteristic based on the result of the measurement, similar to those of the RFVCO 250, for the intermediate frequency VCO (IFVCO) 230 and transmission VCO (TXVCO) 240 as well. Moreover, the high frequency IC 200 is configured to perform these functions associated with the IFVCO 230 and TXVCO 240 in time division using a common circuit.

Figure 4A:
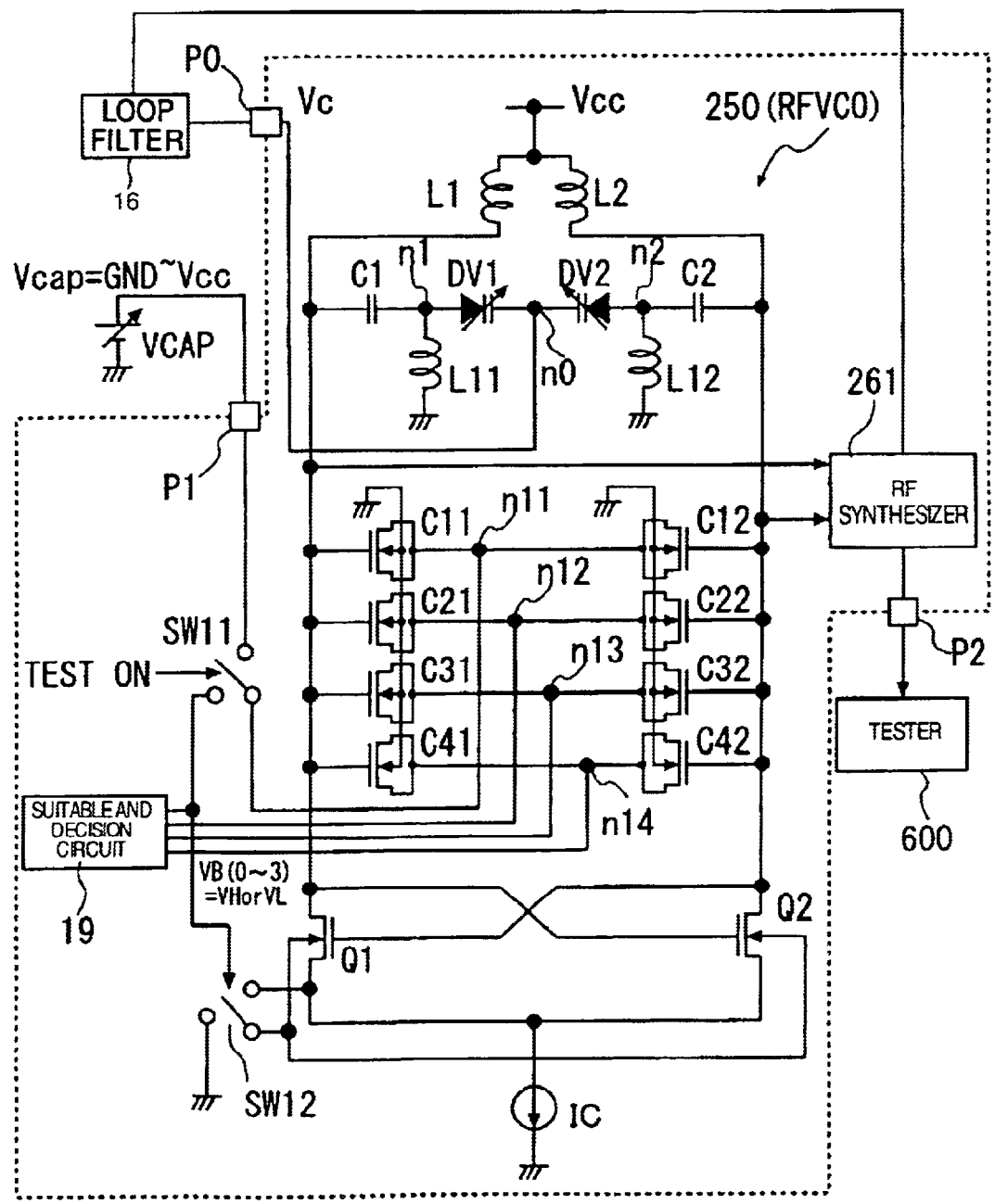
FIG. 4, which is comprised of FIGS. 4A and 4B, is a circuit diagram illustrating one embodiment of an LC resonance oscillation circuit according to the present invention.
Figure 4B:
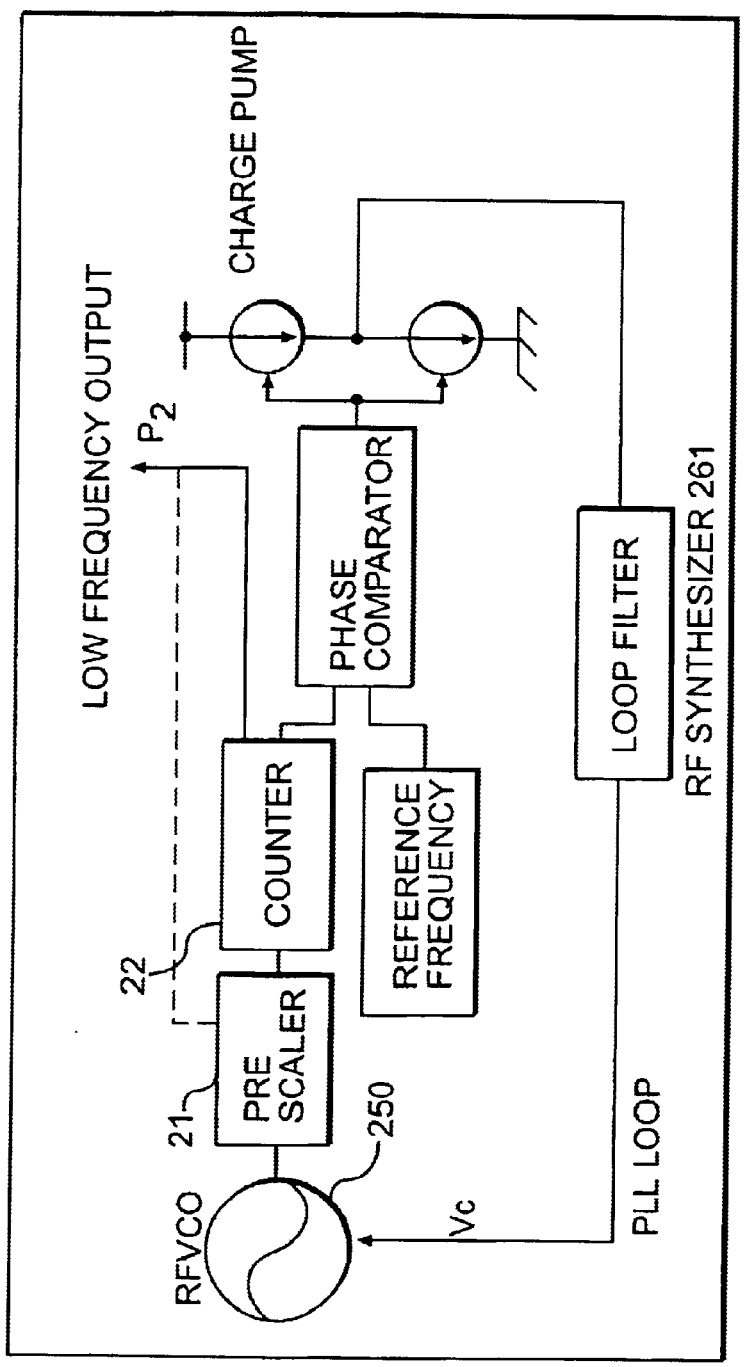

One embodiment of the present invention specific to the RFVCO 250 by way of example will be described with reference to FIG. 4, which is comprised of FIGS. 4A and 4B.

The oscillation circuit in this embodiment is an LC resonance oscillation circuit which comprises a pair of N-channel MOS transistors Q1, Q2 having sources commonly connected and gates and drains cross-coupled to each other; a regulated current source Ic connected between the common source of the transistors Q1, Q2 and a ground point GND; inductors (coils) L1, L2 connected between the drains of the respective transistors Q1, Q2 and a power supply voltage terminal Vcc, respectively; a capacitor C1, varactor diodes Dv1, Dv2 as variable capacitive elements, and a capacitor C2 connected in series between the drain terminals of the transistors Q1, Q2; an inductor L11 connected between a connection node n1 between the capacitor C1 and varactor diode Dv1 and the ground point GND as a choke coil for grounding a reference DC voltage; a choke inductor L12 connected between a connection node n2 between the varactor diode Dv2 and capacitor C2 and the ground point GND; capacitors C11, C12 connected in series between the drain terminals of transistors Q11, Q12; and capacitors C21, C22; C31, C32; C41, C42 connected in parallel with the capacitors C11, C12.

In the oscillation circuit of this embodiment, a control voltage Vc from a loop filter 16 of the PLL circuit is applied at a connection node n0 between the varactor diodes Dv1 and Dv2 to continuously change the oscillating frequency. A band selection signal VB3–VB0 from a suitable band decision circuit 19 is supplied to a connection node n11 between the capacitors C11, C12; a connection node n12 between the capacitors C21, C22; a connection node n13 between the capacitors C31, C32; and a connection node n14 between the capacitors C41, C42 to change the oscillating frequency step by step.

The capacitors C11, C12 have the same capacitance, and likewise the capacitors C21 and C22; C31 and C32; C41 and C42 have the same capacitances, respectively. It should be noted that the capacitances of the capacitors C11, C21, C31 and C41 are set to have weighting factors of 2 to the $m^{th}$ power (m is 3, 2, 1, 0), respectively, such that the capacitance is changed in 16 steps in accordance with a combination of VB3–VB0, and the oscillation circuit operates in any of the frequency characteristics in 16 bands shown in FIG. 2.

Further, in the oscillation circuit of this embodiment, a switch SW11 is provided halfway in a path for transmitting the band selection signal VB3 to the connection node n11 between the capacitors C11, C12, such that a voltage Vcap can be supplied from a variable voltage source VCAP in place of the band selection signal VB3 by switching the switch SW11. The switch SW11 is controlled by a control signal TESTON supplied from the control circuit 260 in a test mode, for example, in the circuit of FIG. 1. A terminal (pad) may be provided for inputting the control signal TESTON from the outside.

Also, in the oscillation circuit of this embodiment, a switch SW12 is provided on a substrate of the transistors Q1, Q2, i.e., between a well region and source terminal, such that a ground potential can be applied to the well in place of a source potential by switching the switch SW12. The switch SW12 is controlled by the most significant bit (MSB) BV3 of the band selection signal VB3–VB0 outputted from the suitable band decision circuit 19.

The switches SW11, SW12 may be each formed of a transmission gate which has a P-channel MOS transistor and an N-channel MOS transistor connected in parallel in order to prevent the level of the signal from falling. In this event, a substrate potential of the P-channel MOS transistor forming part of the switch SW11, SW12 may be fixed to the power supply voltage Vcc, while a substrate potential of the N-channel MOS transistor may be fixed to the ground potential GND.

In the LC resonance oscillation circuit of this embodiment, the capacitors C11–C42 are formed of N-channel MOS transistors. Also, in this embodiment, on-chip elements are used for the inductors L1, L2, L11, L12. This is intended to reduce the number of parts, but instead, externally connected elements may be used. The inductors L11, L12 are provided in addition to the inductors L1, L2 for reducing the dependency of the oscillating frequency on the power supply voltage vcc, so that L11, L12, C1, C2 may be omitted, in which case the varactor diodes are connected in reverse.

Figure 5:
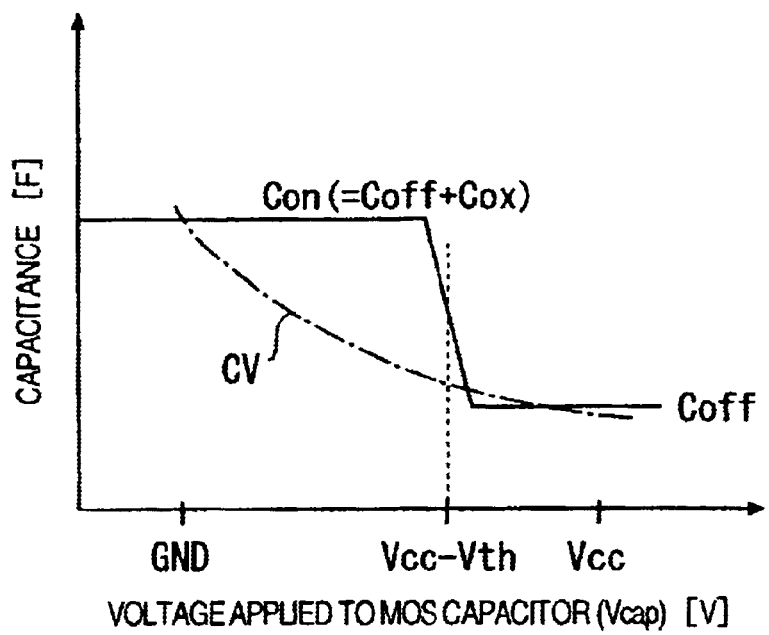
FIG. 5 is a graph showing the voltage-capacitance characteristic of a MOS capacitor which forms part of the VCO according to the embodiment.

FIG. 5 shows the characteristics of the MOS capacitors C11, C12 used in the LC resonance oscillation circuit illustrated in FIG. 4. In FIG. 5, the horizontal axis represents a voltage between the terminals of the MOS capacitors C11, C12, i.e., the voltage Vcap applied to the connection node nil while the constant potential Vcc is applied to the connection node (output node) between the inductors L1, L2, the vertical axis represents the capacitances of the MOS capacitors C11, C12; and Vth is a threshold voltage as the MOS transistor. It can be seen from FIG. 5 that the MOS capacitor has a large capacitance when the voltage Vcap is sufficiently lower than (Vcc–Vth), while the MOS capacitor has a small capacitance when the voltage Vcap is sufficiently higher than (Vcc–Vth). Also, near (Vcc–Vth), the capacitance of the MOS capacitor largely varies and presents substantially a constant value except for this transition region.

The capacitance of the MOS capacitors C11, C12 largely varies as described because the MOS capacitors C11, C12 only have a gate parasitic capacitor Coff since the MOS capacitor, when regarded as a MOS transistor, turns off when the voltage Vcap is higher than (Vcc–Vth), whereas an inversion layer is formed below the gate electrode when the voltage Vcap is lower than (Vcc–Vth) so that the capacitance is equal to the sum of the parasitic capacitance Coff and the capacitance Cox of the gate oxide film of the MOS capacitor (Coff+Cox). The varactor diodes Dv1, Dv2 have the voltage-capacitance characteristic as indicated by a one-dot-chain line CV in FIG. 5.

Figure 6:
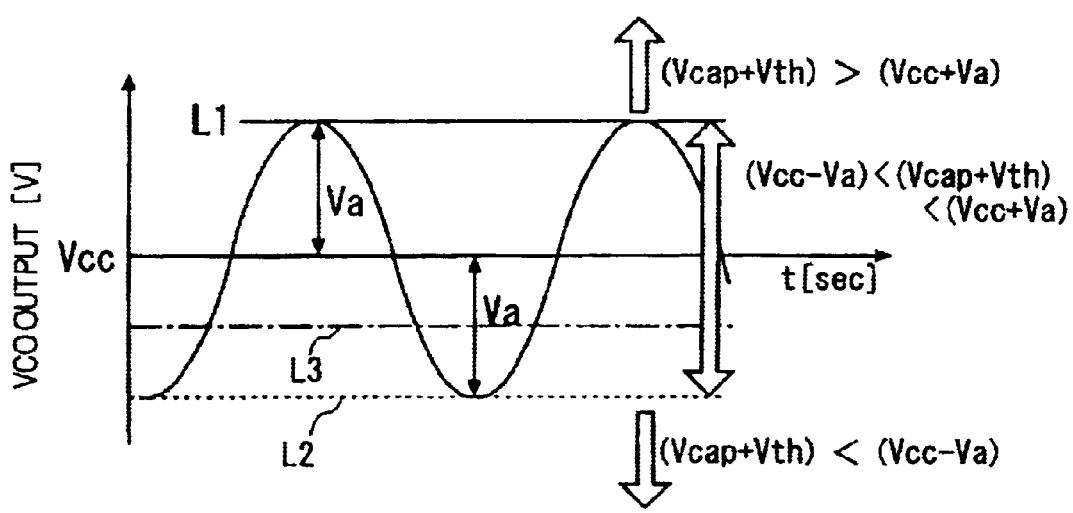
FIG. 6 is a waveform chart showing the relationship between the output and a control voltage of the MOS capacitor in the VCO according to the embodiment.

Thus, in the LC resonance oscillation circuit illustrated in FIG. 4, the capacitances of the MOS capacitors C11, C12 may vary in response to a changing level of the oscillation output Vout depending on the output amplitude. Specifically, the oscillation output Vout changes in a sinusoidal shape over the amplitude±Va about Vcc, as shown in FIG. 6. In this event, when the voltage Vcap applied to the MOS capacitors C11, C12 satisfies the condition (Vcap+Vth)>(Vcc+Va) as indicated by a solid line L1, the capacitance of the MOS capacitors C11, C12 remains at Coff.

On the other hand, when Vcap satisfies the condition (Vcap+Vth)<(Vcc−Va) as indicated by a broken line L2, the capacitance of the MOS capacitors C11, C12 remains at (Coff+Cox). On the other hand, when Vcap satisfies the condition (Vcc−Va)<(Vcap+Vth)<(Vcc+Va) as indicated by a chain line L3, the capacitance of the MOS capacitors C11, C12 varies and is expressed as the sum of integrated (Coff+Cox) and Coff in accordance with the proportion of an MOS capacitor's ON-time ton to an MOS capacitor's OFF-time toff in one period.

As the capacitance of the MOS capacitors C11, C12 varies in response to the voltage Vcap in the manner described above, the oscillating frequency fvco of the LC resonance oscillation circuit also varies. As appreciated, conversely, even with the constant voltage Vcap, the oscillating frequency varies if the output amplitude Va of the oscillation circuit varies. In this event, the output amplitude Va is correlated to the oscillating frequency fvco. In this embodiment, this correlation is utilized to measure the oscillating frequency fvco, thereby estimating the output amplitude Va. For measuring the frequency, the voltage Vc inputted from an external terminal P0 and applied to the connection node n0 between the varactor diodes Dv1, Dv2 is chosen to be a fixed voltage (DC voltage VDC), the switch SW11 is switched to select the control voltage Vcap, and the nodes n12–n14 are applied with either the power supply voltage Vcc or ground potential GND.

Figure 7:
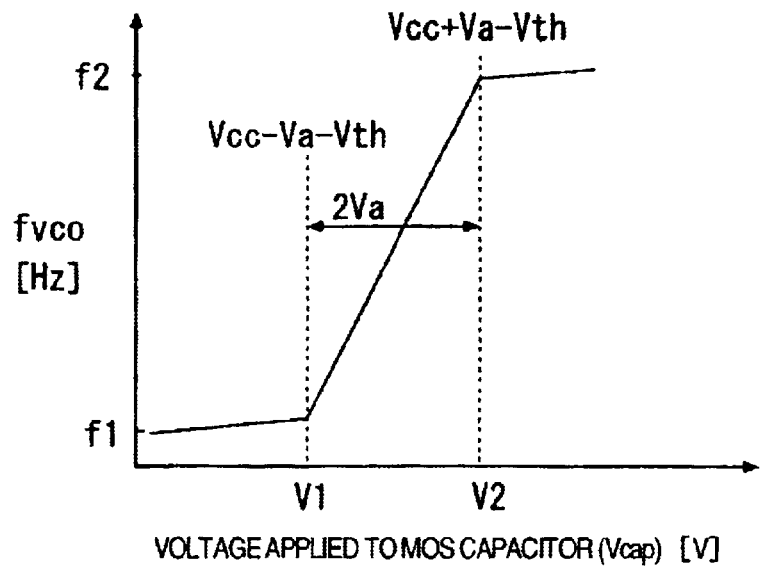
FIG. 7 is a graph showing the relationship between the control voltage of the MOS capacitor and the oscillating frequency in the VCO according to the embodiment.

FIG. 7 shows the correlation of the voltage Vcap applied to the MOS capacitor to the oscillating frequency fvco. As can be seen from FIG. 7, the oscillating frequency fvco remains at a low constant value f1 when the voltage Vcap is lower than V1 (=Vcc−Va−Vth), and the oscillating frequency fvco remains at a high constant value f2 when the voltage Vcap is higher than V2 (=Vcc+Va−Vth). Also, the oscillating frequency fvco substantially linearly changes when the voltage Vcap is between V1 and V2. Then, the difference (V2−V1) between the values V1 and V2 of the voltage Vcap, when the oscillating frequency fvco changes, substantially corresponds to the amplitude 2Va of the oscillation output at that time.

Figure 8:
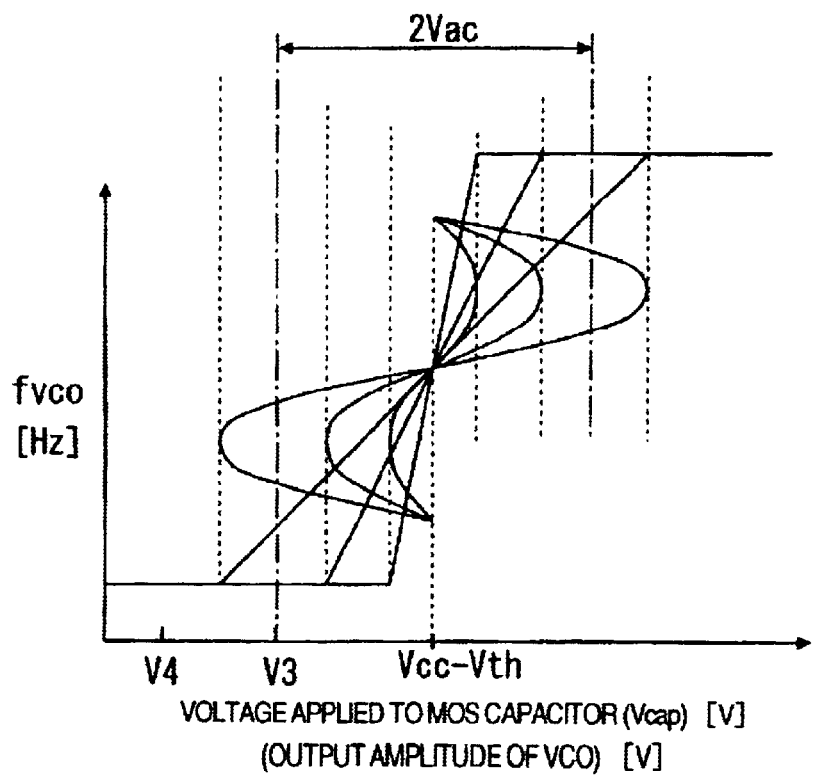
FIG. 8 is a graph showing the relationship between the control voltage of the MOS capacitor, the oscillating frequency, and the output amplitude in the VCO according to the embodiment.

FIG. 8 shows a correlation of the amplitude of the oscillating output in addition to the correlation of the voltage Vcap to the oscillating frequency fvco. In FIG. 8, a voltage V0 corresponding to an intersection of correlation curves of Vcap and fvco is equivalent to Vcc−Vth. Assume that it is determined in a selection test that a high frequency IC passes when the oscillation circuit has an amplitude larger than Vac in FIG. 7, and a high frequency IC fails when the oscillation circuit has an amplitude smaller than Vac. For example, frequencies f3, f4 are measured with the voltage Vcap set at V3 and at V4 smaller than V3 and compared with each other. It can be determined that a high frequency IC passes when f3>f4, and fails when f3=f4.

In an actual selection test, as shown in FIG. 4, the variable voltage source VCAP is connected to an external terminal P1 to which the switch SW11 is connected. A test mode is set by the control circuit 260, and the switch S11 is switched to the external terminal P1 to apply one terminal of each of the capacitors C11, C12 with predetermined voltages (V3, V4). A tester 600 is connected to a monitor terminal P2 to which an RF synthesizer 261 is connected, to measure an oscillating signal divided by the prescaler 21 or read a value counted by the counter 22. Then, the measured or read oscillating frequencies f3, f4 can be compared with each other to determine pass/fail. The test mode is set by the control circuit 260 by sending a predetermined command from the tester 600 to the control circuit 260 through a serial data signal SDATA in place of the baseband circuit 300 shown in FIG. 1.

Next, description will be made on how the parasitic capacitance is controlled by switching the switch SW12.

As is well known, a depletion layer changes in thickness in accordance with the magnitude of voltage applied to a PN junction, and a change in the thickness of the depletion layer causes a change in the parasitic capacitance. Specifically, as a larger voltage is applied, the depletion layer becomes thicker to reduce the parasitic capacitance. Conversely, as a smaller voltage is applied, the depletion layer becomes thinner to increase the parasitic capacitance. The oscillation circuit according to this embodiment takes advantage of this phenomenon to switch the switch SW12 connected to the substrate, i.e., the well region of the transistors Q1, Q2 using the most significant bit (MSB) BV3 of the band selection signal VB3–VB0 outputted from the suitable band decision circuit 19 to apply the substrate of the transistors Q1, Q2 with a source voltage or ground potential GND to change the parasitic capacitance.

Figure 9:
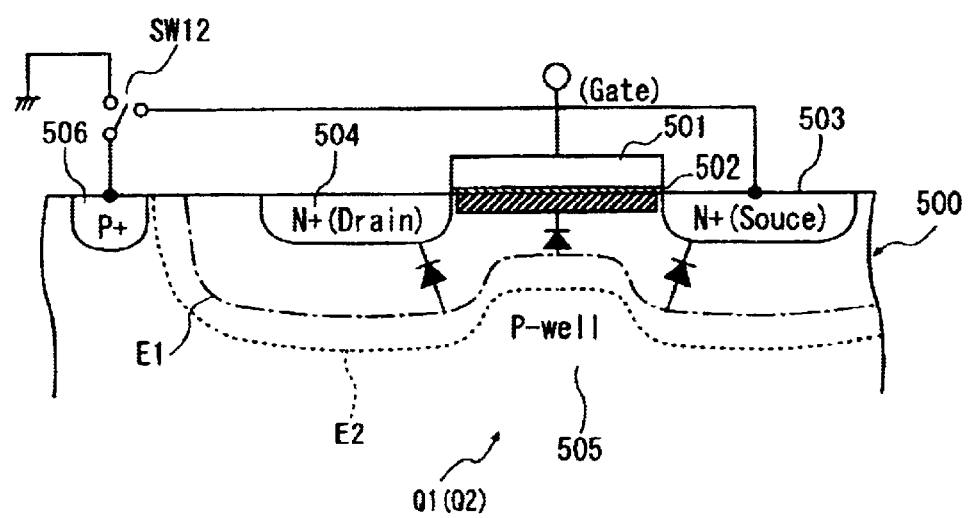
FIG. 9 is an explanatory cross-sectional view illustrating the structure of a MOS transistor having a parasitic capacitance in the VCO according to the embodiment, and a change in a depletion layer.

In the oscillation circuit of FIG. 4, when the substrate of the transistors Q1, Q2 is applied with the source voltage through the switch SW12, the depletion layer between a drain region D and the substrate (P-WELL) has a small thickness, with a large parasitic capacitance, as indicated by a chain line E1 in FIG. 9. On the other hand, when the substrate of the transistors Q1, Q2 is applied with the ground potential GND through the switch SW12, the depletion layer between the drain D and substrate (P-WELL) has a large thickness, with a small parasitic capacitance, as indicated by a broken line E2 in FIG. 9.

In FIG. 9, the illustrated MOS transistor comprises a semiconductor substrate 500; a gate insulating film 502 formed on the surface of the substrate 500; a gate electrode 501 formed on the gate insulating film 502; a source region 503 and a drain region 504 formed of an N-type diffusion layer on both sides of the gate electrode 501; a P-well region 505 in which the MOS transistor is formed; and a powering region 506 made of a P-type diffusion layer for applying a bias voltage to the well region 505. In FIG. 9, the powering region 506 is positioned adjacent to the drain region 504. Alternatively, the powering region 506 may be positioned near the source region 503, or made in such a shape as to surround the drain region 504 in an inverted C-shape when seen in a plan view.

The switching control as described above acts in the following manner. In the bands of the oscillation circuit, the respective frequency characteristics are as indicted by solid lines in FIG. 2 before the switch SW12 is switched (when the source voltage is selected). When the switch W12 is switched to apply the ground potential GND to the substrate of the transistors Q1, Q2, the frequency characteristics of the bands Band8–Band15 are changed to the characteristics as indicated by one-dot-chain lines in FIG. 2 in the available bands Band0–Band15 of the oscillation circuit. In this way, a variable frequency range of the entire oscillation circuit is extended as compared with an oscillation circuit without the switch SW12 for switching the voltage applied to the substrate of the transistors Q1, Q2.

When the potential applied to the substrate is switched with the capacitances of the capacitors C11–C42 set such that the frequency characteristics of the bands Band0–Band15 are drawn at equal intervals, the interval between the bands Band7 and Band8 is only extended as shown in FIG. 2. Therefore, the capacitances of the capacitors C11–C42 should be previously set such that the frequency characteristics of the bands Band0–Band15 are drawn at equal intervals after the potential applied to the substrate of the transistors Q1, Q2 is switched by the switch SW12.

Figure 10:
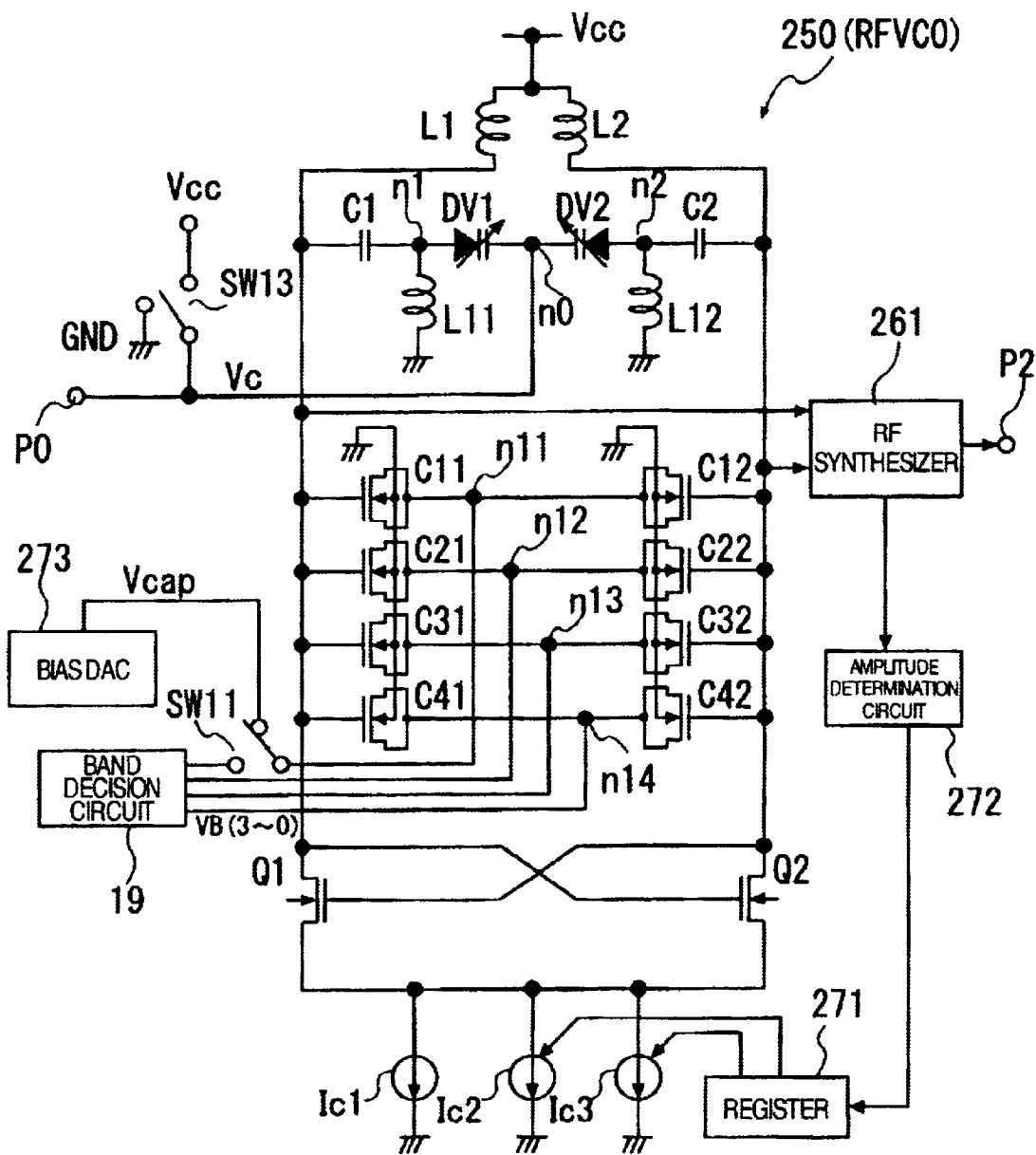
FIG. 10 is a circuit diagram illustrating a second embodiment of the LC resonance oscillation circuit according to the present invention.

FIG. 10 illustrates another embodiment of the present invention relating to the RFVCO 250. In FIG. 10, elements identical to those in FIG. 4 are designated the same reference numerals, and repetitive description is omitted.

The oscillation circuit illustrated in FIG. 10 differs from the oscillation circuit illustrated in FIG. 4 in that three regulated current sources Ic1, Ic2, Ic3 are connected between the common source of the transistors Q1, Q2 and the ground point; that the former oscillation circuit additionally comprises a register 271 for controlling the regulated current sources Ic1, Ic2, Ic3 to turn ON/OFF, and an amplitude determination circuit 272 for determining a set value for the register 271 in accordance with the amplitude of the oscillation output of the oscillation circuit 250, determined based on a frequency value outputted from the RF synthesizer 261; that a switch SW13 is provided for applying the power supply voltage Vcc or the ground potential GND in place of a voltage from an external terminal as a voltage applied to the connection node n0 between the varactor diodes Dv1, Dv2; and that a DA convertor circuit 273 is provided for locally generating the control voltage Vcap applied to the connection node n11 between the MOS capacitors C11, C12 through the switch SW11 in the test mode.

Figure 11:
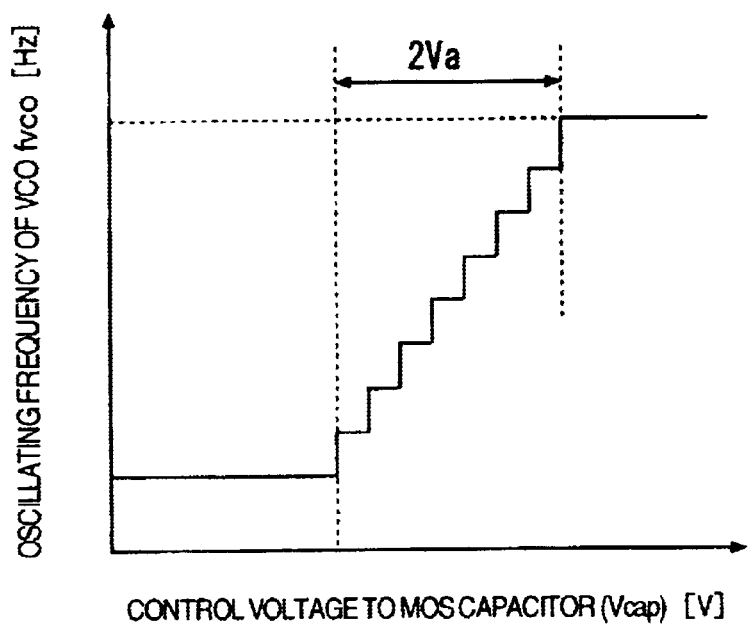
FIG. 11 is a graph showing the relationship between a control voltage of a MOS capacitor and the oscillating frequency in the LC resonance oscillation circuit according to the second embodiment.

FIG. 11 shows the relationship between the control voltage Vcap generated by the DA converter circuit 273 and the oscillating frequency fvco of the oscillation circuit. As can be seen from FIG. 11, the frequency characteristic can be examined by changing the control voltage Vcap and the oscillating frequency fvco of the oscillation circuit to detect the frequency by a frequency detector circuit 272.

Figure 12:
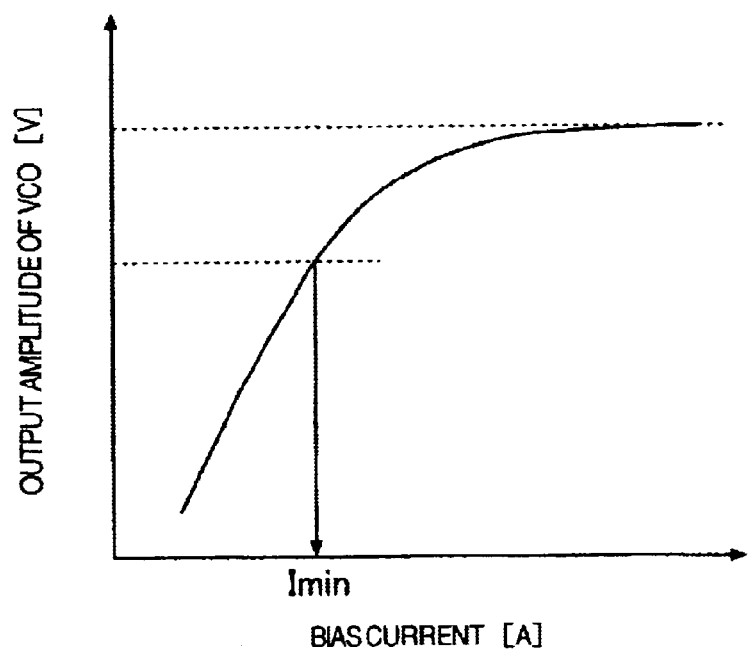
FIG. 12 is a graph showing the relationship between a bias current and an output amplitude in the LC resonance oscillation circuit.

FIG. 12 in turn shows the relationship between a bias current supplied from the regulated current source Ic and the output amplitude of the oscillation circuit in the LC resonance oscillation circuit. In the embodiment of FIG. 4, an oscillation circuit having an output amplitude equal to or lower than a predetermined level is determined to fail. In the embodiment of FIG. 10, on the other hand, if the output amplitude is equal to or lower than a predetermined level when the oscillation circuit is operated only with the current from the regulated current source Ic1 with the regulated current sources Ic2, Ic3 being turned off, the regulated current sources Ic2, Ic3 can be turned on to increase the bias current to increase the output amplitude, so that the yield rate can be improved.

The number of regulated current sources is not limited to three, but may be four or more. In addition, the current supplied from each of the regulated current sources Ic2, Ic3 may be the same as that of the regulated current source Ic1. Alternatively, these current sources may be weighted by two to the $m^{th}$ power.

In addition, a minimum bias current Imin which provides a desired amplitude may be found by measuring the current with different numbers of regulated current sources which are turned on, and a set value in the register 271 may be changed to provide the bias current Imin, thereby setting minimally required power consumption for the oscillation circuit. In the high frequency IC illustrated in FIG. 1, the current consumed by the RFVCO 250 accounts for a relatively large proportion in the current consumed by the entire chip. Thus, the optimization of the current consumed by the oscillation circuit, as in this embodiment, can advantageously reduce the current consumed by the entire chip in an effective manner.

While the invention created by the inventors has been described in detail in connection with several embodiments thereof, the present invention is not limited to the foregoing embodiments. For example, the embodiment illustrated in FIG. 10 does not comprise the switch SW12 for changing the parasitic capacitance by changing the substrate potential applied to the transistors Q1, Q2 shown in FIG. 4. However, this embodiment may comprise the switch SW12 as well for switching the substrate potential applied to the transistors Q1, Q2, as is the case with the embodiment illustrated in FIG. 4.

In a modification, the N-channel MOS transistors Q1, Q2 in FIGS. 4 and 10 may be changed to P-channel MOS transistors. In this case, the MOS transistor constituting each of capacitors C11 to C42 is changed to a P-channel MOSFET. The Vcc connected to inductors L1 and L2 is changed to the GND. The GND connected to the current source IC is changed to Vcc. The switch SW12 in FIG. 4 is operated such that the back gate of each of P-channel MOSFETs Q1, Q2 is connected to a source thereof or a potential (for example, Vcc) higher than the source potential. The ground point in SW12 is changed to Vcc.

Further, while the foregoing embodiment has been described for a specific VCO which has 16 available bands, the present invention can be applied to a VCO which has eight or four available bands. With eight bands, the VCO may comprise three sets of MOS capacitors (C11–C42). With four bands, the VCO may comprise two sets of MOS capacitors. Also, while the foregoing embodiment has been described for the measurements of the frequency and oscillating amplitude of the RFVCO 250 as an example, the present invention can be applied as well to measurements of the frequencies and amplitudes of the TXVCOs 240a, 240b, and to measurements of the frequency and amplitude of the IFVCO 230.

In the foregoing description, the present invention made by the inventors has been discussed mainly in connection with the application of the invention to an RFVCO in a high frequency IC for use in a radio communication system such as a portable telephone which is capable of communicating in accordance with four communication schemes: GSM850, GSM900, DCS1800, PCS1900 which are the field of utilization that underlies the invention. The present invention, however, is not limited to this particular RFVCO, but may be applied as well to a VCO in a communication IC which applies the frequency hopping in communications in accordance with a data communication scheme, called Bluetooth, in a local area, and other VCOs which have wide variable frequency ranges.

Representative advantages provided by the invention disclosed in this application may be summarized as follows.

The present invention can realize a voltage controlled oscillation circuit (VCO) which is capable of measuring the output amplitude and oscillating frequency without affecting the characteristic of the VCO, and capable of reducing a parasitic capacitance, which affects the oscillating frequency, to oscillate at a high frequency, and a communication semiconductor integrated circuit which contains the VCO.

Further, a radio communication system which uses the communication semiconductor integrated circuit according to the present invention can communicate signals in a plurality of frequency bands. Moreover, an RFVCO, an IFVCO, and a TXVCO can be formed on a single semiconductor chip together with a modulator circuit, a demodulator circuit, and the like, thereby achieving a reduction in the number of parts which constitute the system, as well as the size of the system.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. An LC resonant oscillation circuit comprising:
    an LC resonance circuit;
    a MOS transistor for supplying a bias current to said LC resonance circuit;
    a plurality of capacitive elements coupled to an output node of said LC resonance circuit, said plurality of capacitive elements being supplied with respective selection voltages at terminals thereof opposite to the output node for selecting an oscillating frequency band such that the oscillating frequency band is step by step changeable in accordance with said respective selection voltages; and
    a variable capacitive element coupled to the output node of said LC resonance circuit, the variable capacitive element being supplied with a variable voltage at a terminal opposite to the output node for tuning an oscillating frequency in the selected oscillating frequency band,
    said plurality of capacitive elements including at least one first capacitive element, the capacitance of which changes in accordance with a voltage applied thereto, said at least one first capacitive element including a terminal opposite to said output node, and the opposite terminal of said at least one first capacitive element being supplied with a voltage for measuring an amplitude of an output signal of the LC resonant oscillation circuit.

2. An LC resonant oscillation circuit according to claim 1, further comprising:
    switching means for selecting the respective selection voltage or a second variable voltage for application to the at least one first capacitive element; and
    a control circuit for generating a signal for controlling said switching means, said control circuit controlling said switching means to select the respective selection voltage in a normal operation and controlling said switching means to select said voltage in a test mode.

3. An LC resonant oscillation circuit according to claim 1, further comprising:
    a divider circuit for dividing a signal outputted from said output node;
    a counter circuit for counting a signal divided by said divider circuit; and
    an external terminal for outputting the signal divided by said divider circuit or a value counted by said counter circuit.

4. An LC resonant oscillation circuit according to claim 1, further comprising an external terminal for applying said voltage.

5. An LC resonant oscillation circuit according to claim 1, wherein the at least one first capacitive element is a MOS capacitor.

6. An LC resonant oscillation circuit comprising:
    an LC resonance circuit;
    a MOS transistor for driving said LC resonance circuit;
    a plurality of capacitive elements connected to an output node of said LC resonance circuit, plurality of said capacitive elements being supplied with respective selection voltages at terminals thereof opposite to the output node for selecting an oscillating frequency band such that the oscillating frequency band is step by step changeable in accordance with said respective selection voltages; and
    substrate voltage switching means for switching a substrate potential of said MOS transistor to a source potential or to a fixed potential.

7. An LC resonant oscillation circuit according to claim 6, wherein:
    said plurality of capacitive elements are formed to have different capacitances from one another; and
    said substrate voltage switching means is controlled to switch said substrate potential of said MOS transistor in accordance with the respective selection voltage applied to the capacitive element having the largest capacitance.

8. A communication semiconductor integrated circuit comprising:
    an oscillation circuit according to claim 1; and
    a mixer for mixing an oscillating signal of said oscillation circuit or a signal divided from said oscillating signal with a received signal to generate a signal at a frequency corresponding to a difference in frequency between the oscillating signal or the divided signal and the received signal.

9. A communication semiconductor integrated circuit according to claim 8, wherein said oscillation circuit is capable of generating an oscillating signal from which is generated a signal mixed with a received signal conforming to a GSM (Global System for Mobile Communication) scheme or an oscillating signal from which is generated a signal mixed with a received signal conforming to a DCS (Digital Cellular System) scheme.

10. A semiconductor integrated circuit comprising:
    an LC resonant oscillator circuit including an LC resonance circuit, a MOS transistor for supplying a bias current to said resonance circuit, and a plurality of capacitive elements connected to an output node of said LC resonance circuit, said plurality of capacitive elements being supplied with respective selection voltages at terminals thereof opposite to the output node, said selection voltages selecting an oscillating frequency band such that the oscillating frequency band is step by step changeable in accordance with said selection voltages, said plurality of capacitive elements including at least one first capacitive element, the capacitance of which changes in accordance with a voltage applied thereto, said at lease one first capacitive element including a terminal opposite to said output node supplied with a variable voltage instead of the selection voltage;

a divider circuit for dividing an oscillating signal generated by said LC resonant oscillator circuit;

a frequency band selector circuit for generating said selection voltages;

a variable voltage generator circuit for generating said variable voltage;

switching means for selecting either said selection voltage or said variable voltage for application to said at least one first capacitive element;

a counter circuit for counting a signal divided by said divider circuit;

amplitude determining means for determining the amplitude of an oscillating output of said LC resonant oscillator circuit based on the signal divided by said divider circuit or a value counted by said counter circuit; and current control means for controlling a driving current of said LC resonant oscillation oscillator circuit in accordance with the result of determination made by said amplitude determining means.

11. An LC resonant oscillation circuit according to claim 6, wherein said MOS transistor is a N channel type MOS transistor and wherein said fixed potential is a potential lower than said source potential.

12. An LC resonant oscillation circuit according to claim 6, wherein said MOS transistor is a P channel type MOS transistor and wherein said fixed potential is a potential higher than said source potential.

13. In a semiconductor integrated circuit having an oscillation circuit, the oscillation circuit comprising:

an inductance element;

a first variable capacitive element having a first terminal coupled to the inductance element, and a second terminal which receives a variable voltage, wherein a frequency of an output signal of the oscillation circuit is tuned in accordance with the variable voltage; and a second variable capacitive element having a first terminal coupled to the inductance element, and a second terminal which receives a voltage, wherein an amplitude of the output signal of the oscillation circuit is measured as a change in the frequency of the output signal by changing a value of the voltage.

14. A semiconductor integrated circuit according to claim 13, wherein the first terminal of the first variable capacitive element and the first terminal of the second variable capacitive element are coupled to a terminal of the inductance element, and wherein the output signal is provided from the terminal of the inductance element.

15. A semiconductor integrated circuit according to claim 14, wherein said oscillation circuit further comprises a plurality of capacitive elements having first terminals coupled to the terminal of the inductance element, and second terminals receiving selection for selecting an oscillating frequency band such that the oscillating frequency band is step by step changeable in accordance with said selection voltages.

16. A semiconductor integrated circuit according to claim 15, further comprising;

a counter coupled to the oscillation circuit that counts the frequency of the output signal of the oscillation circuit in a measuring mode for measuring the amplitude of the output signal of the oscillation circuit.

* * * * *